(12) United States Patent
Nuebling

(10) Patent No.: US 11,146,341 B1
(45) Date of Patent: Oct. 12, 2021

(54) CAPACITIVE DATA TRANSMISSION OVER A GALVANIC ISOLATION

(71) Applicant: Infineon Technologies AG, Neubiberg (DE)

(72) Inventor: Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/037,264

(22) Filed: Sep. 29, 2020

(51) Int. Cl.
*H04B 1/04* (2006.01)
*H04B 15/02* (2006.01)
*H04B 1/40* (2015.01)
*H03H 7/01* (2006.01)

(52) U.S. Cl.
CPC ........... *H04B 15/02* (2013.01); *H03H 7/0153* (2013.01); *H04B 1/40* (2013.01)

(58) Field of Classification Search
CPC .. H04B 15/02; H04B 1/40; H04B 2001/1063; H03H 7/0153; H03H 11/04; H03H 7/06; H03H 7/0161; H03H 11/38
See application file for complete search history.

(56) References Cited

U.S. PATENT DOCUMENTS

| | | | |
|---|---|---|---|
| 8,198,951 B2 | 6/2012 | Dong et al. | |
| 10,324,144 B2 | 6/2019 | Gruber et al. | |
| 10,659,173 B1 | 5/2020 | Li et al. | |
| 2007/0103258 A1* | 5/2007 | Weinstein | H03H 9/2431 333/186 |
| 2014/0354357 A1* | 12/2014 | Shrestha | H03F 3/45071 330/252 |
| 2017/0117877 A1* | 4/2017 | Ha | H04L 25/12 |
| 2019/0068410 A1* | 2/2019 | Al-Shyoukh | H03H 11/04 |
| 2021/0028657 A1* | 1/2021 | Goodchild | G01P 15/00 |

FOREIGN PATENT DOCUMENTS

| | | |
|---|---|---|
| DE | 102010013266 A1 | 10/2010 |
| EP | 3016337 A1 | 5/2016 |
| EP | 2658195 B1 | 8/2018 |

OTHER PUBLICATIONS

Danesh et al., "A Q-Factor Enhancement Technique for MMIC Inductors," 1998 IEEE MTT-S International Microwave Symposium Digest, Jun. 1998, 4 pp.

* cited by examiner

*Primary Examiner* — Tuan Pham
(74) *Attorney, Agent, or Firm* — Shumaker & Sieffert, P.A.

(57) ABSTRACT

In some examples, a device is arranged to include a galvanic isolation barrier between first and second voltage domains. The device includes first and second capacitors arranged across the galvanic isolation barrier. The first and second capacitors are configured to communicate differential signals between the first and second domains. The device also includes a common mode suppression circuit arranged in the second voltage domain and configured to suppress a common mode signal communicated by the first and second capacitors. The common mode suppression circuit include a first passive RLC filter circuit coupled between the first capacitor and a low-impedance node. The common mode suppression circuit also includes a second passive RLC filter circuit coupled between the second capacitor and a low-impedance node.

20 Claims, 13 Drawing Sheets

CAPACITIVE DATA TRANSMISSION OVER A GALVANIC ISOLATION

TECHNICAL FIELD

This disclosure relates to communication across a galvanic isolation barrier in an electronic device.

BACKGROUND

Galvanic isolation is used in electronic devices to separate two voltage domains. As one example, a microcontroller may generate and deliver control signals to a low-side gate driver and a high-side gate driver for a half-bridge circuit. Galvanic isolation is typically not necessary between the microcontroller and the low-side gate driver, but the microcontroller will normally be galvanically isolated from the high-side gate driver because the microcontroller and the high-side gate driver are driven by different power supplies. For example, the high-side gate driver usually has a different reference power supply (e.g., reference ground) than the microcontroller. The microcontroller will normally use the same reference power supply as the low-side gate driver, while the high-side gate driver may use the switch node of the half-bridge circuit as a reference power supply and/or a reference ground node (e.g., a floating ground).

SUMMARY

This disclosure describes techniques for suppressing common mode signals communicated across a galvanic isolation barrier. Differential signals may be communicated across the galvanic isolation barrier using a first capacitor and a second capacitor, but common mode signals may be undesirable and may cause damage to sensitive circuitry. A common mode suppression circuit of this disclosure may include two passive RLC filter circuits. A first passive RLC filter circuit may be coupled between the first capacitor and a low-impedance node, and a second passive RLC filter circuit may be coupled between the second capacitor and the low-impedance node.

In some examples, a device is arranged to include a galvanic isolation barrier between first and second voltage domains. The device includes first and second capacitors arranged across the galvanic isolation barrier. The first and second capacitors are configured to communicate differential signals between the first and second domains. The device also includes a common mode suppression circuit arranged in the second voltage domain and configured to suppress a common mode signal communicated by the first and second capacitors. The common mode suppression circuit include a first passive RLC filter circuit coupled between the first capacitor and a low-impedance node. The common mode suppression circuit also includes a second passive RLC filter circuit coupled between the second capacitor and a low-impedance node.

In some examples, a method includes receiving a first signal from a first capacitor arranged across a galvanic isolation barrier and receiving a second signal from a second capacitor arranged across the galvanic isolation barrier. The method may also include filtering the first signal through a first passive RLC filter circuit coupled between the first capacitor and a low-impedance node. The method can further include filtering the second signal through a second passive RLC filter circuit coupled between the second capacitor and the low-impedance node.

In some examples, a system includes a first capacitor arranged across a galvanic isolation barrier and a second capacitor arranged across the galvanic isolation barrier. The system also includes an oscillator configured to generate a control signal, a first driver stage configured to generate a first driver signal based on the control signal and to deliver the first driver signal to a first side of the first capacitor, and a second driver stage configured to generate a second driver signal based on the control signal and to deliver the second driver signal to a first side of the second capacitor. The system further includes a receiver circuit and a common mode suppression circuit include a first passive RLC filter circuit coupled between a second side of the first capacitor, the receiver circuit, and the low-impedance node, where the second side of the first capacitor is different than the first side of the first capacitor, and where the first passive RLC filter circuit is configured to receive the first driver signal from the first capacitor. The common mode suppression circuit also includes a second passive RLC filter circuit coupled between the second capacitor, the receiver circuit, and the low-impedance node, where the second side of the second capacitor is different than the first side of the second capacitor, and where the second passive RLC filter circuit is configured to receive the second driver signal from the second capacitor.

The details of one or more examples are set forth in the accompanying drawings and the description below. Other features, objects, and advantages will be apparent from the description and drawings, and from the claims.

BRIEF DESCRIPTION OF DRAWINGS

FIGS. 6A-9 are conceptual block and circuit diagrams of example common mode suppression circuits, in accordance with the techniques of this disclosure.

DETAILED DESCRIPTION

This disclosure describes devices, methods, and techniques for suppressing common mode signals communicated across a galvanic isolation barrier. An electronic device may include a galvanic isolation barrier for separating circuitry with two different voltage levels, to protect a user, and/or to protect sensitive circuitry. Two capacitors may be configured to communicate differential signals across the galvanic isolation barrier from a first voltage domain to a second voltage domain. However, a common mode pulse may occur on one side of the galvanic isolation barrier. In some examples, the common mode pulse may be electrical noise caused by an electrostatic discharge, a test impulse applied during a laboratory testing, and/or any other noise between two galvanically separated power domains. If sensitive circuitry on either side of the galvanic isolation barrier experiences the common mode pulse, the pulse may damage the sensitive circuitry.

This disclosure describes a common mode suppression circuit for absorbing or suppressing the energy of a common mode signal. The common mode suppression circuit may include passive RLC filter circuits that are designed to suppress common mode signals but do not suppress differential signals.

Figure 1:
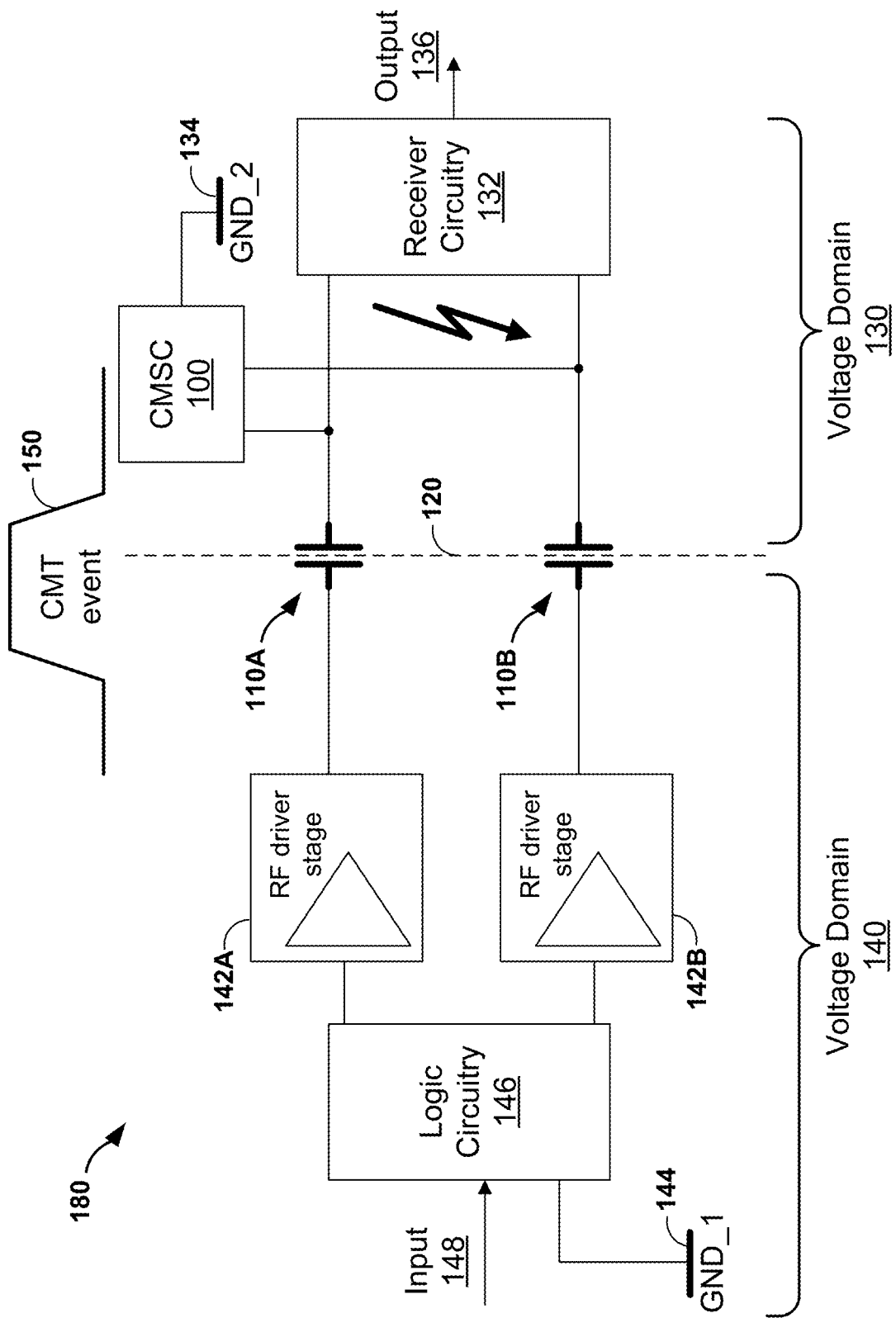
FIG. 1 is a conceptual block and circuit diagram of a common mode suppression circuit coupled to two capacitors arranged across a galvanic isolation barrier, in accordance with the techniques of this disclosure.

FIG. 1 is a conceptual block diagram of a common mode suppression circuit 100 coupled to two capacitors 110A and 110B arranged across a galvanic isolation barrier 120, in accordance with the techniques of this disclosure. Device 180 is depicted in FIG. 1 as including voltage domains 130 and 140, which have different reference ground connections 134 and 144. Voltage domain 130 includes common mode suppression circuit 100 and receiver circuitry 132. Voltage domain 140 includes optional radio-frequency (RF) driver stages 142A and 142B and logic circuitry 146. Voltage domains 130 and 140 may be part of a single die or distributed across two or more semiconductor dies within device 180.

Common mode suppression circuit 100 may be configured to suppress common mode signals while allowing differential signals to pass from capacitors 110A and 110B to receiver circuitry 132. Common mode suppression circuit 100 may have low impedance for common mode event 150, allowing the common mode signals to travel to reference ground connection 134. Common mode suppression circuit 100 may also have high impedance for differential signals, such that differential signals pass by common mode suppression circuit 100 while traveling from capacitors 110A and 110B to receiver circuitry 132.

Capacitors 110A and 110B may be configured to communicate signals between voltage domains 130 and 140. In examples in which capacitors 110A and 110B are connected as shown in FIG. 1, capacitors 110A and 110B may be configured to allow high-frequency signals to pass while blocking low-frequency signals such as direct-current signals. Common mode transient event 150 may have a high voltage slew rate that can travel across galvanic isolation barrier 120 through capacitors 110A and 110B. For example, common mode transient event 150 may have a slew rate of one hundred volts per nanosecond. In examples in which capacitors 110A and 110B have capacitances of one hundred femtofarads, the discharge current caused by common mode event 150 will be ten milliamperes, which can damage receiver circuitry 132.

Galvanic isolation barrier 120 includes the dielectric material, insulating material, and/or oxide material of capacitors 110A and 110B. Galvanic isolation barrier 120 may include mold compound between two semiconductor dies and/or a deep trench within a semiconductor die. In some examples, galvanic isolation barrier 120 may be configured to protect a user from electric shock. Additionally or alternatively, galvanic isolation barrier 120 may be configured to allow communication between the voltage domains with relatively low power dissipation, as compared to a resistance-based level shifter or a transistor-based level shifter, both of which will experience resistive power losses when stepping up electrical signals.

Voltage domain 130 may have a different voltage range than voltage domain 140. For example, the ranges of voltage domains 130 and 140 may be separated by any voltage difference, such as a few volts or less, tens of volts, or hundreds of volts. Each of voltage domains 130 and 140 may be on separate semiconductor dies within a package of device 180. Galvanic isolation barrier 120 may run between the separate dies and/or partially across one or both of the dies. In some examples, a first voltage domain may have a range of less than ten volts, and a second voltage domain may have a range of hundreds or thousands of volts.

One example application of device 180 is for generating driver signals for a high-side switch of a power converter. For example, logic circuitry 146 may be part of a microcontroller that generates control signals for high-side switch (es) and low-side switch(es) of the power converter. A low-side switch of the power converter may have the same reference ground connection 144 as logic circuitry 146. A high-side switch of the power converter, however, may have a floating potential that is different than the power supply of logic circuitry 146, and reference ground connection 134 may be connected to the switch node of a half- or full-bridge circuit. The floating potential of receiver circuitry 132 may be tens or hundreds of volts higher than the power supply of logic circuitry 146. Common mode event 150 may be generated when the high-side switch is activated, which increases the floating potential of the high-side switch. Other example applications of device 180 include an isolated controller area network or an isolated coupler.

Receiver circuitry 132 may be configured to receive a differential signal from capacitors 110A and 110B and generate output 136 based on the differential signal. In some examples, receiver circuitry 132 may be configured to tolerate very low voltage ranges, such as a range of three or five volts. Receiver circuitry 132 may include sensitive input-output circuitry for receiving and processing signals from capacitors 110A and 110B.

Logic circuitry 146 may be configured to generate a differential signal for transmission across galvanic isolation barrier 120 to voltage domain 130. Logic circuitry 146 may be configured to generate the differential signal based on input 148. In some examples, logic circuitry 146 and/or RF driver stages 142A and 142B may include an oscillator for generating the differential signal as an oscillating signal using, for example, amplitude-shift keying such as on-off keying. Logic circuitry 146 can deliver the differential signal to RF driver stages 142A and 142B for amplification and/or encoding before transmitting the differential signal across galvanic isolation barrier 120. Logic circuitry 146 and/or RF driver stages 142A and 142B may be configured to activate or deactivate a carrier frequency in response to the signals received from logic circuitry 146. RF driver stages 142A and 142B and logic circuitry 146 may each be coupled to reference ground connection 144.

Common mode event 150 may have sufficient amplitude to damage receiver circuitry 132. To prevent a high-amplitude common mode event from reaching receiver circuitry, an existing device may activate a clamping diode to clamp the differential lines. However, clamping the differential lines prevents communication across a galvanic isolation barrier because the clamping prevents the electrical current on the differential lines.

Other existing devices include a suppression circuit with a transistor network to suppress a common mode signal from reaching receiver circuitry. A transistor network may be connected to low- and high-side power supply nodes, which can cause noise and disturbance in one or both of the power supply nodes. In addition, the transistor network may use a bias current to suppress a common mode signal, and the bias current must be high because the transistors in the transistor network are so fast.

In accordance with the techniques of this disclosure, common mode suppression circuit 100 may include two passive RLC filter circuits coupled to a low-impedance node, such as reference ground connections 134. Common mode suppression circuit 100 may include a first passive RLC filter circuit coupled between capacitor 110A and reference ground connections 134. Common mode suppression circuit 100 may include a second passive RLC filter circuit coupled between capacitor 110B and reference ground connections 134. Each passive RLC filter circuit can include an inductor coil and a capacitor, where the resistance (R) may represent the inherent resistance of the inductor coil and/or a discrete resistor.

Using a passive RLC filter circuit may result in reduced power dissipation in suppressing common mode signals, as compared to an active filter including transistors and/or other active elements. In addition, an RLC filter may more effectively filter common mode signals than an RC filter that does not have an inductor coil. Moreover, common mode suppression circuit 100 may allow the use of less expensive capacitors 110A and 110B, which can lead to an overall cost reduction for device 180.

Figure 2:
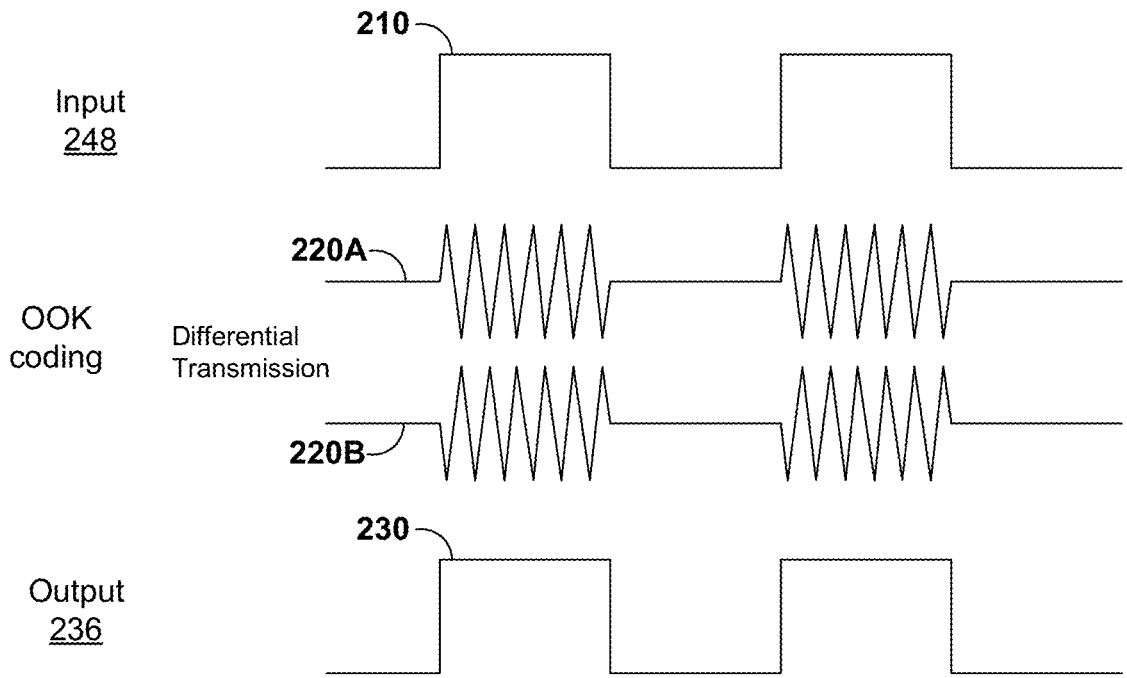
FIG. 2 is a timing diagram illustrating on-off keying encoding, in accordance with the techniques of this disclosure.

FIG. 2 is a timing diagram illustrating on-off keying encoding, in accordance with the techniques of this disclosure. On-off keying is just one example of encoding for the differential signals communicated across a galvanic isolation barrier. Other example encoding protocols include digital amplitude modulation, amplitude shift-keying, phase shift keying, and/or quadrature amplitude modulation.

Logic circuitry can receive input signal 248 and generate differential signals 220A and 220B for transmission across a galvanic isolation barrier. During pulse 210 of input signal 248, the logic circuitry may be configured to generate differential signals 220A and 220B that oscillate at a particular frequency. The logic circuitry may be configured to switch on a carrier frequency in response to input signal 210 having a logical one or high value and switch off the carrier frequency in response to input signal 210 having a logical zero or low value. The oscillating waveform of differential signal 220A may be the inverse of the oscillating waveform of differential signal 220B, such that signal 220A reaches a maximum amplitude when signal 220B reaches a minimum amplitude. The logic circuitry may be configured to generate differential signals 220A and 220B as direct current signals when input signal 210 is between pulses or when input signal 210 has a low or inactive voltage.

Receiver circuitry may be configured to receive differential signals 220A and 220B, which are transmitted across a galvanic isolation barrier. The receiver circuitry may be configured to then generate output signal 236 based on differential signals 220A and 220B, such that pulse 230 of output signal 236 occurs when differential signals 220A and 220B are oscillating. The receiver circuitry may be configured to generate output signal 236 with a low or inactive voltage (e.g., between pulses of output signal 236) occur when differential signals 220A and 220B are not oscillating.

In some examples, a common mode suppression circuit may be designed with a transfer function peak frequency that matches the carrier frequency of the differential signals communicated across a galvanic isolation barrier. More particularly, a frequency associated with a peak of the transfer function of the combined circuit including the common mode suppression circuit and the first and second capacitors may be approximately equal to the carrier frequency of the differential signals. As a result, the discharge current of a common mode disturbance will flow directly through the common mode suppression circuit to ground, thereby dampening the common mode disturbance. A differential signal will experience peaking in the auto-transfer function, which will allow the differential signal to pass the common mode suppression circuit to the receiver circuitry.

Figure 3:
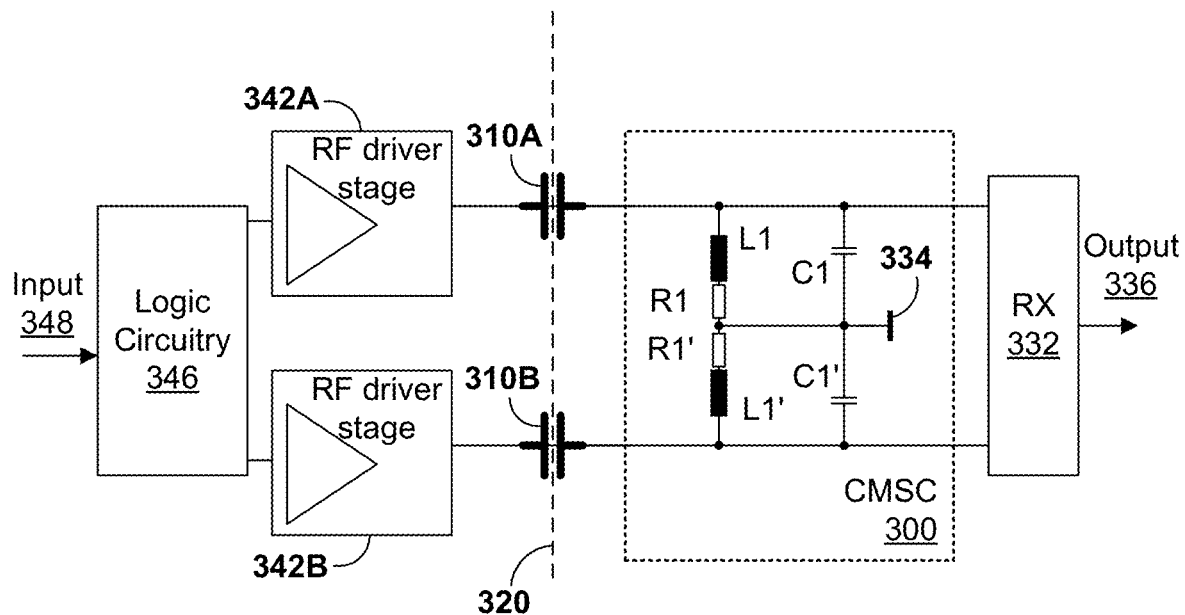
FIG. 3 is a conceptual block and circuit diagram of a common mode suppression circuit including two inductive coils, in accordance with the techniques of this disclosure.

FIG. 3 is a conceptual block and circuit diagram of a common mode suppression circuit 300 including two inductive coils L1 and L1', in accordance with the techniques of this disclosure. In the example device shown in FIG. 3, common mode suppression circuit 300 includes two passive RLC filter circuits. The first passive RLC filter circuit includes inductor coil L1, resistance R1, and capacitor C1 coupled between capacitor 310A and reference ground connection 334. The second passive RLC filter circuit includes inductor coil L1', resistance R1', and capacitor C1' coupled between capacitor 310B and reference ground connection 334. Thus, as shown in FIG. 3, the circuit elements of common mode suppression circuit 300 are arranged symmetrically about reference ground connection 334.

Logic circuitry 346 may be configured to generate a differential signal based on input signal 348. Optional RF driver stages 342A and 342B may be configured to amplify and/or encode the differential signal generated by logic circuitry 346 for transmission across galvanic isolation barrier 320. Common mode suppression circuit 300 may be configured to present a high impedance to differential signals received from capacitors 310A and 310B while presenting a low impedance to common mode signals received from capacitors 310A and 310B. The low impedance of common mode suppression circuit 300 can allow the common mode signals to pass through common mode suppression circuit 300 to reference ground connection 334, rather than traveling to receiver circuitry 332. A low-impedance node such as reference ground connection 334 can sink most or all of the energy of common mode pulse event, preventing the common mode pulse event from reaching receiver circuitry 332.

FIG. 3 depicts inductor coil L1 and resistance R1 coupled in parallel with capacitor C1, but other configurations are possible. For example, each of inductor coil L1, resistance R1, and capacitor C1 may be coupled in parallel with each other between capacitor 310A and reference ground connection 334. Resistance R1 may be the inherent resistance of inductor coil L1, or resistance R1 may be a discrete resistor.

In some examples, the characteristics of the components of the first and second passive RLC filter circuits may be symmetrical or identical. For example, the inductance of inductor coil L1 may be equal to the inductance of inductance coil L1'. In other examples, the differences between the parameters and characteristics of the components of the first and second passive RLC filter circuits may be within a tolerance, such as twenty, ten, five, two, or one percent. The parameters and characteristics of a passive RLC filter circuit include the inductance, capacitance, and/or resistance of the circuit.

Figure 4:
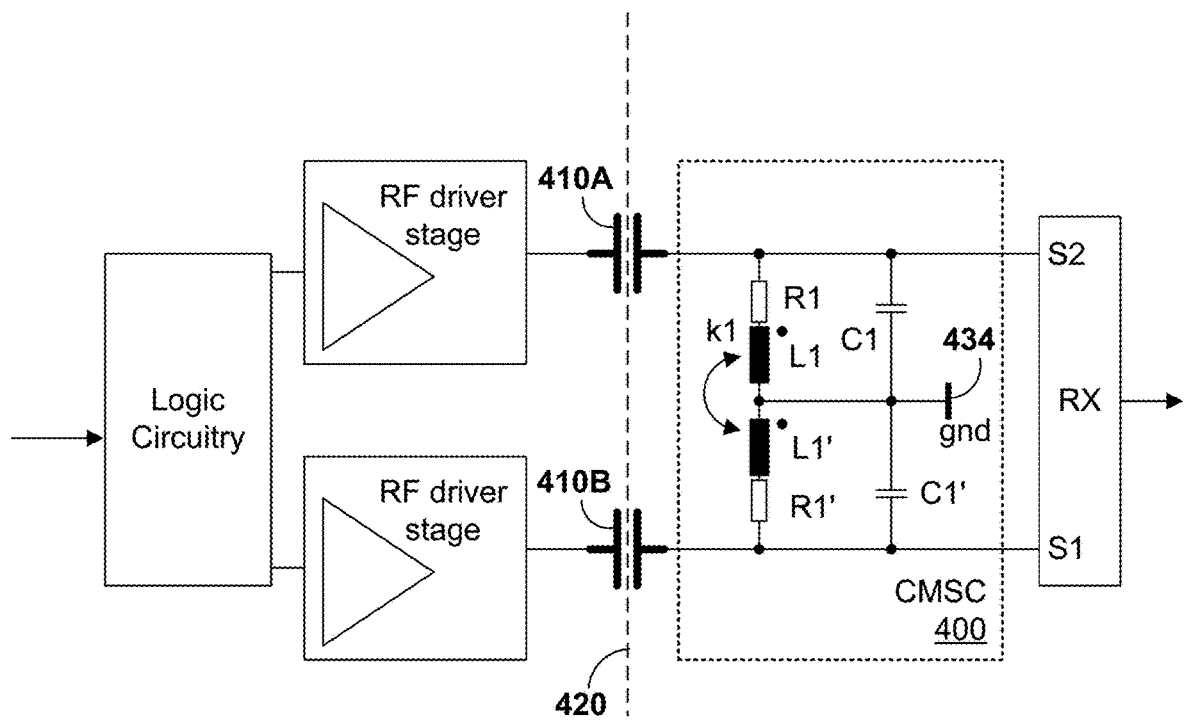
FIG. 4 is a conceptual block and circuit diagram of a common mode suppression circuit including two interleaved inductive coils, in accordance with the techniques of this disclosure.

FIG. 4 is a conceptual block and circuit diagram of a common mode suppression circuit 400 including two interleaved inductive coils L1 and L1', in accordance with the techniques of this disclosure. Interleaved inductive coils L1 and L1' have a coupling coefficient kl, which represents the percentage of flux that is linked between the coils. To achieve a tightly coupled inductor pair and a high coupling coefficient, inductive coils L1 and L1' may be interleaved and may overlap each. To achieve a high coupling coefficient, inductive coils L1 and L1' may be arranged symmetrically. One example technique for interleaving inductive coils L1 and L1' is shown in FIG. 5.

Figure 5:
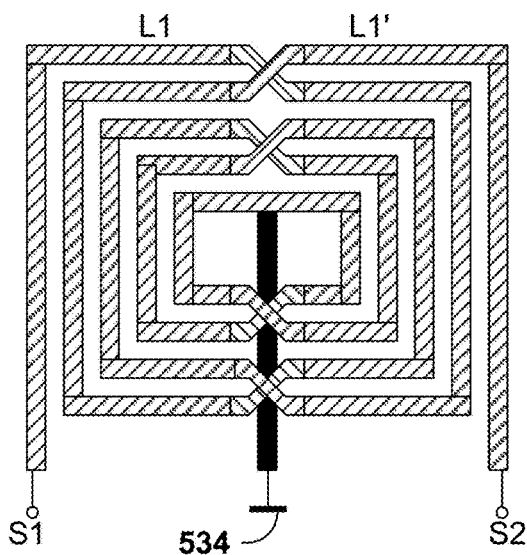
FIG. 5 is a diagram of two interleaved inductive coils, in accordance with the techniques of this disclosure.

FIG. 5 is a diagram of two interleaved inductive coils L1 and L1', in accordance with the techniques of this disclosure. Inductor coils L1 and L1' are depicted as interleaved, overlapping coils with a connection to reference ground connection 534 at the midpoint between inductor coils L1 and L1'. FIG. 5 depicts a five-turn or four-turn square overlapping, symmetrical spiral configuration for inductor coils L1 and L1'. In some examples, another shape such as circle, oval, rectangular, or triangular may be used for inductor coils L1 and L1'. Inductor coils L1 and L1' may be on-chip inductor coils.

In some examples, the inductances of inductor coils L1 and L1' may not be exactly symmetrical. It may be desirable to design the inductor coils L1 and L1' to have different levels of inductance, especially if the characteristics of the other circuit components (e.g., capacitances, resistances, etc.) are not symmetrical. Using an overlapping and/or interleaved pair of inductor coils can improve the performance of a common mode suppression circuit. For example, overlapping and/or interleaved inductor coils can result in increased common mode rejection and rejection of common mode signals with higher slew rates.

FIGS. 6A-9 are conceptual block and circuit diagrams of example common mode suppression circuits 600, 700, 800, 900, 902, and 904, in accordance with the techniques of this disclosure. FIGS. 6A-9 depict optional variations for common mode suppression circuits 600, 700, 800, 900, 902, and 904 and oscillators 642, 742, 842, and 942. For example, common mode suppression circuit 600 includes oscillator 642 for generating differential signals for transmission across galvanic isolation barrier 620. Oscillator 642 may be configured to generate a differential signal based on a signal received at input node 648. Oscillator 642 may include a first output node coupled to capacitor 610A and a second output node coupled to capacitor 610B. In some examples, the output nodes of oscillator 642 may be coupled to RF driver stages. Like some of the common mode suppression circuit described in this disclosure, oscillator 642 may also include two interleaved inductor coils.

Oscillator 642 is depicted as including the same inductances L1 and L1', capacitances C1 and C1', and resistances R1 and R1' as common mode suppression circuit 600. Given the matching circuit characteristics, the resonant frequency of oscillator 642 (e.g., the transmission frequency of the differential signals generated by oscillator 642) may be equal to the frequency associated with a peak of the transfer function of common mode suppression circuit 600 and capacitors 610A and 620B. By aligning the resonant frequency of oscillator 642 and the frequency associated with the peak of the transfer function, a differential signal generated by oscillator may pass common mode suppression circuit 600 to receiver circuitry 632. In some examples, these two frequencies may not be exactly equal but may instead be within a threshold percentage, such as one, two, five, ten, or twenty percent. For example, if the resonant frequency of oscillator 642 is five hundred megahertz, and the frequency associated with the peak of the transfer function of common mode suppression circuit 600 and capacitors 610A and 610B is five hundred and ten megahertz, then the difference between these two frequencies is within a two percent tolerance.

Figure 6A:
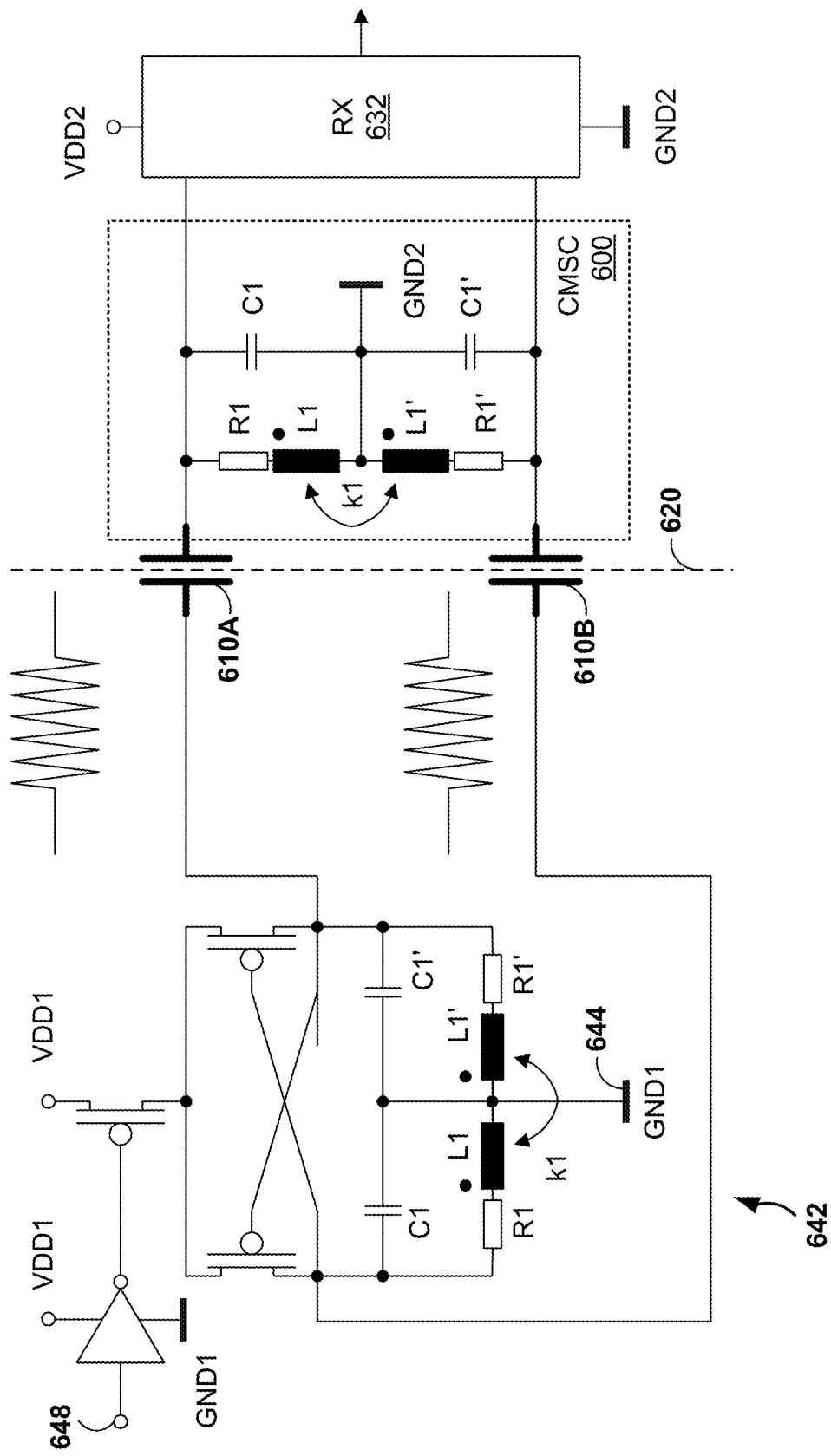
Figure 6B:
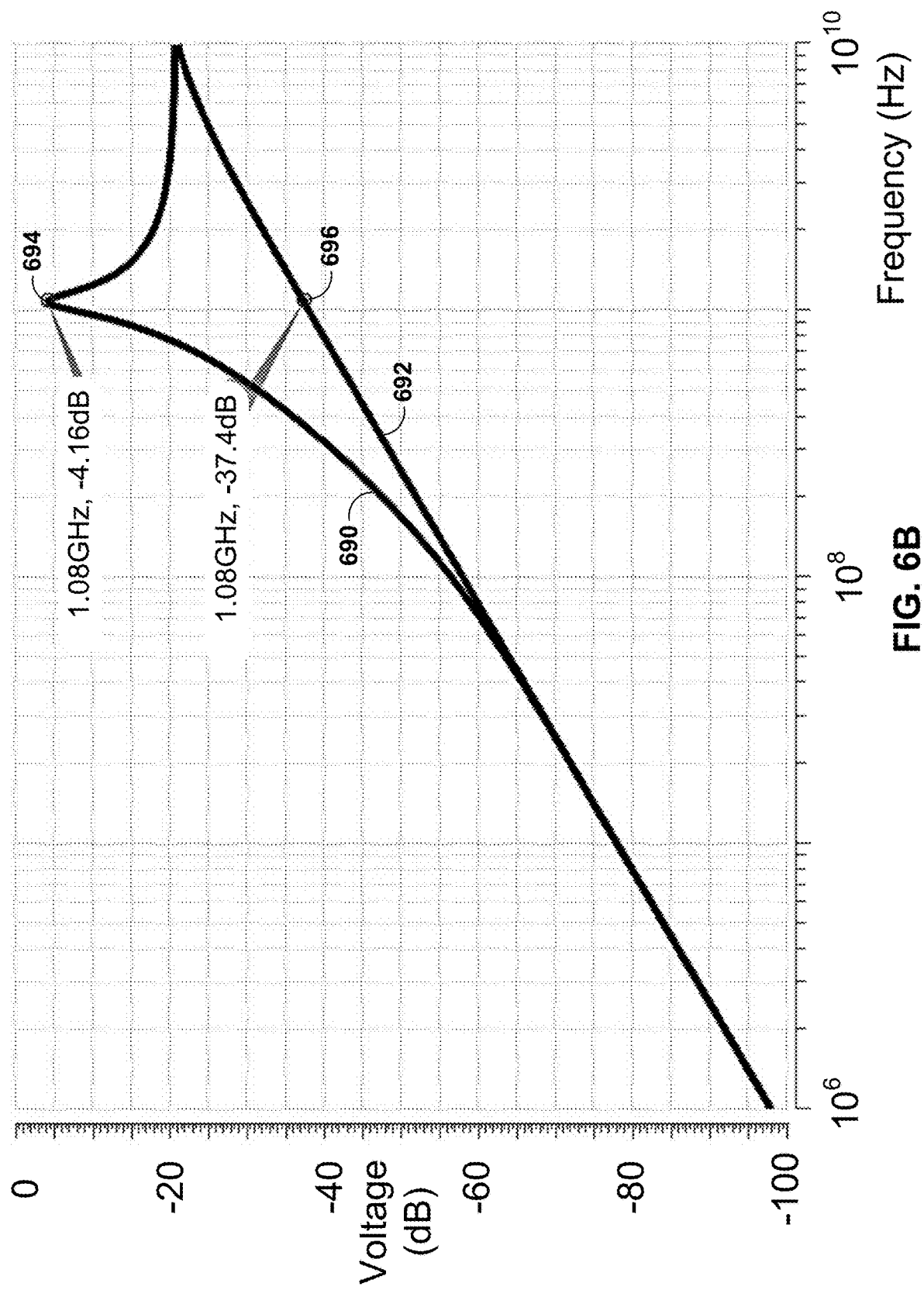
FIG. 6B is a plot of frequency and gain for a differential signal transmitted across a galvanic isolation barrier, in accordance with the techniques of this disclosure.

FIG. 6B is a plot of frequency and gain for a differential signal transmitted across a galvanic isolation barrier, in accordance with the techniques of this disclosure. Curve 690 represents the auto-transfer function of the combined circuit that includes common mode suppression circuit 600 and capacitors 610A and 610B. Curve 692 represents a transfer function for a common mode signal transmitted across galvanic isolation barrier 620. Peak 694 of curve 690 is associated with a frequency at which signals pass from capacitors 610A and 610B to receiver circuitry 632 with the least voltage loss. The example peak frequency shown in FIG. 6B is 1.08 GHz, but common mode suppression circuit 600 and capacitors 610A and 610B may be designed for any other peak frequency. The gain along curve 692 at the peak frequency (e.g., at point 696, −37.4 dB) is much less than the gain of the auto-transfer function (e.g., at point 694, −4.16 dB), which allows a differential signal at the peak frequency to pass from capacitors 610A and 610B to receiver circuitry 632. Thus, for the example shown in FIG. 6B, common mode suppression circuit 600 can suppress a common mode signal by approximately 33 dB at the peak frequency. Equation (1) is an example of an auto-transfer function for capacitor 610A and common mode suppression circuit 600.

$$f_{peak} = \frac{1}{2\pi\sqrt{L_1 \times (C_{610A} + C_1)}} \qquad (1)$$

The resonant frequency of the oscillator and the frequency associated with the peak of the transfer function of the common mode suppression circuit and the differential capacitors may be tuned or adjusted to achieve better matching between these two frequencies. Better matching of these frequencies can lead to better transmission of differential signals and suppression of common mode signals. In addition, tuning can provide for better balance and matching between the two sides of oscillator 742 or between the two sides of common mode suppression circuit 800. For example, oscillator 742 includes tunable capacitors coupled in parallel with capacitors C1 and C1'. Likewise, common mode suppression circuit 800 also includes tunable capacitors coupled in parallel with capacitors C1 and C1'. In some examples, either or both of the oscillator and the common mode suppression circuit may include tunable capacitors, resistors, and/or inductors.

By tuning, adjusting, or trimming the capacitances of oscillator 742 and common mode suppression circuit 800, the resonant frequency of oscillator 742 and the frequency associated with the peak of the transfer function of common mode suppression circuit 800 and capacitors 810A and 810B can be changed and/or matched. In some examples, the tunable elements of oscillator 742 and common mode suppression circuit 800 may be circuit elements that can be connected or disconnected by activating or deactivating switches. For example, an additional capacitor can be connected in parallel to increase the equivalent capacitance by activating one switch on each side of the capacitors to connect the additional capacitor to other capacitors in the circuit.

The tuning of capacitors C1 and C1' can be performed in the manufacturing facility and/or in the field. The tuning of capacitors C1 and C1' may be an automatic process performed by logic circuitry in the device as part of a test mode operation, or the tuning may be performed by an external test device or a technician. The capacitors C1 and C1' may be tested by internal logic, an external test device, or a technician to determine whether there is a mismatch between capacitor C1 and capacitor C1' in oscillator 742 and common mode suppression circuit 800. To improve the matching between capacitor C1 and capacitor C1' in oscillator 742, the capacitors on one or both sides of oscillator 742 may be tuned.

A mismatch between capacitors 710A and 710B or a mismatch between capacitors 810A and 810B can result in a mismatch in amplitudes of signals transmitted across galvanic isolation barrier 720 or 820. For example, a balanced signal transmitted across imbalanced capacitors can create an imbalanced signal. The mismatch between capacitors arranged across a galvanic isolation barrier can be addressed by tuning oscillator 742 or 842 and/or common mode suppression circuit 700 or 800. It may be simpler to tune an oscillator or a common mode suppression circuit than to adjust the characteristics of capacitors 710A, 710B, 810A, and 810B after manufacture.

Figure 7:
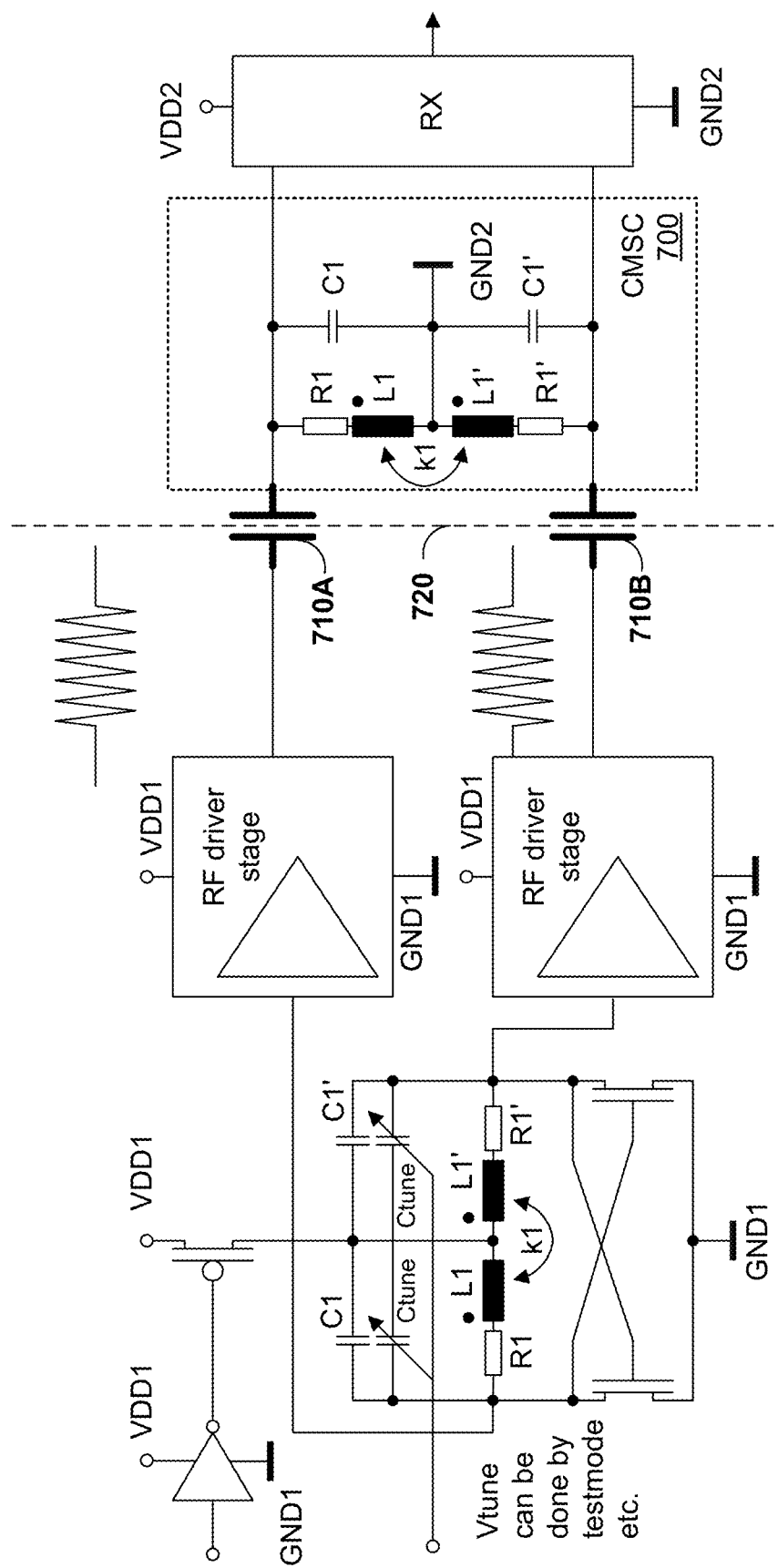
Figure 8:
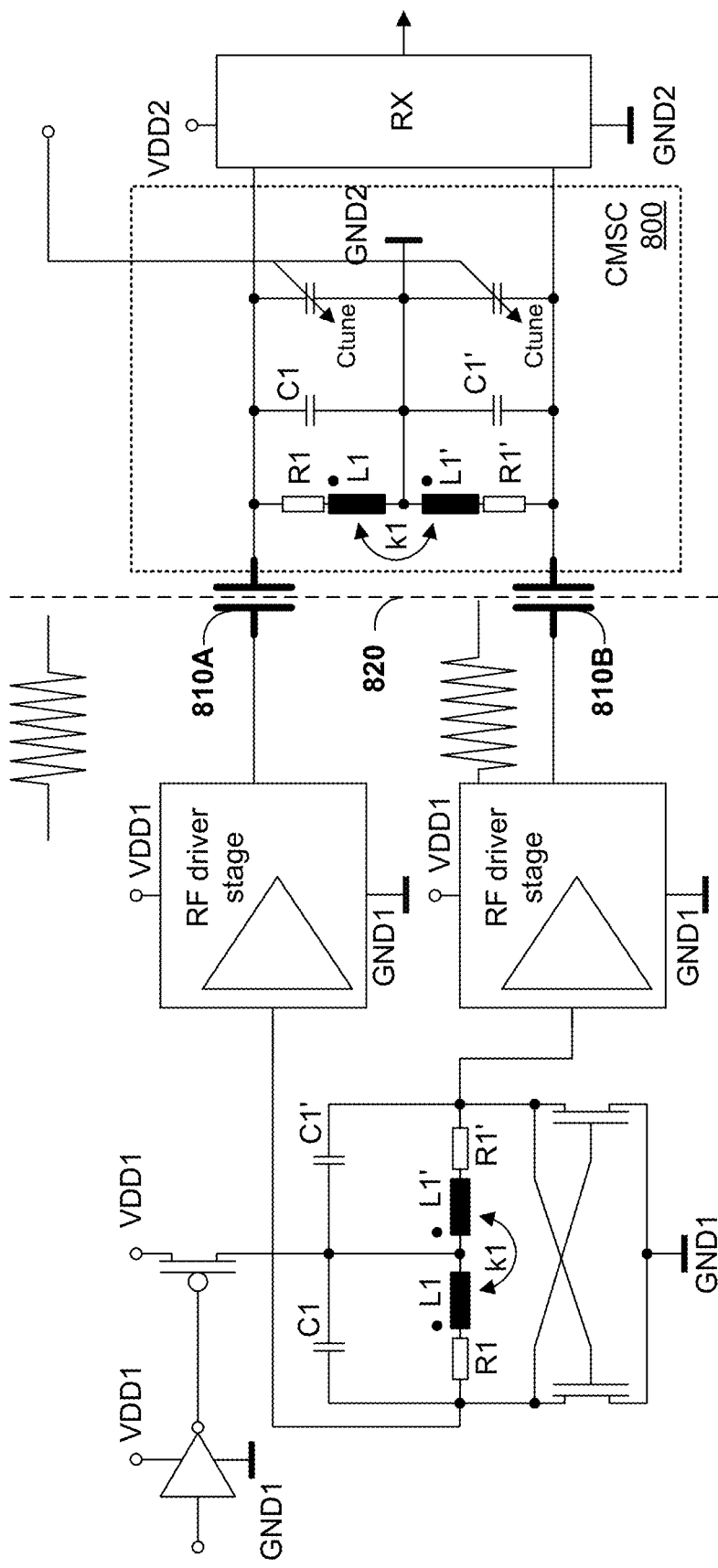
Figure 9:
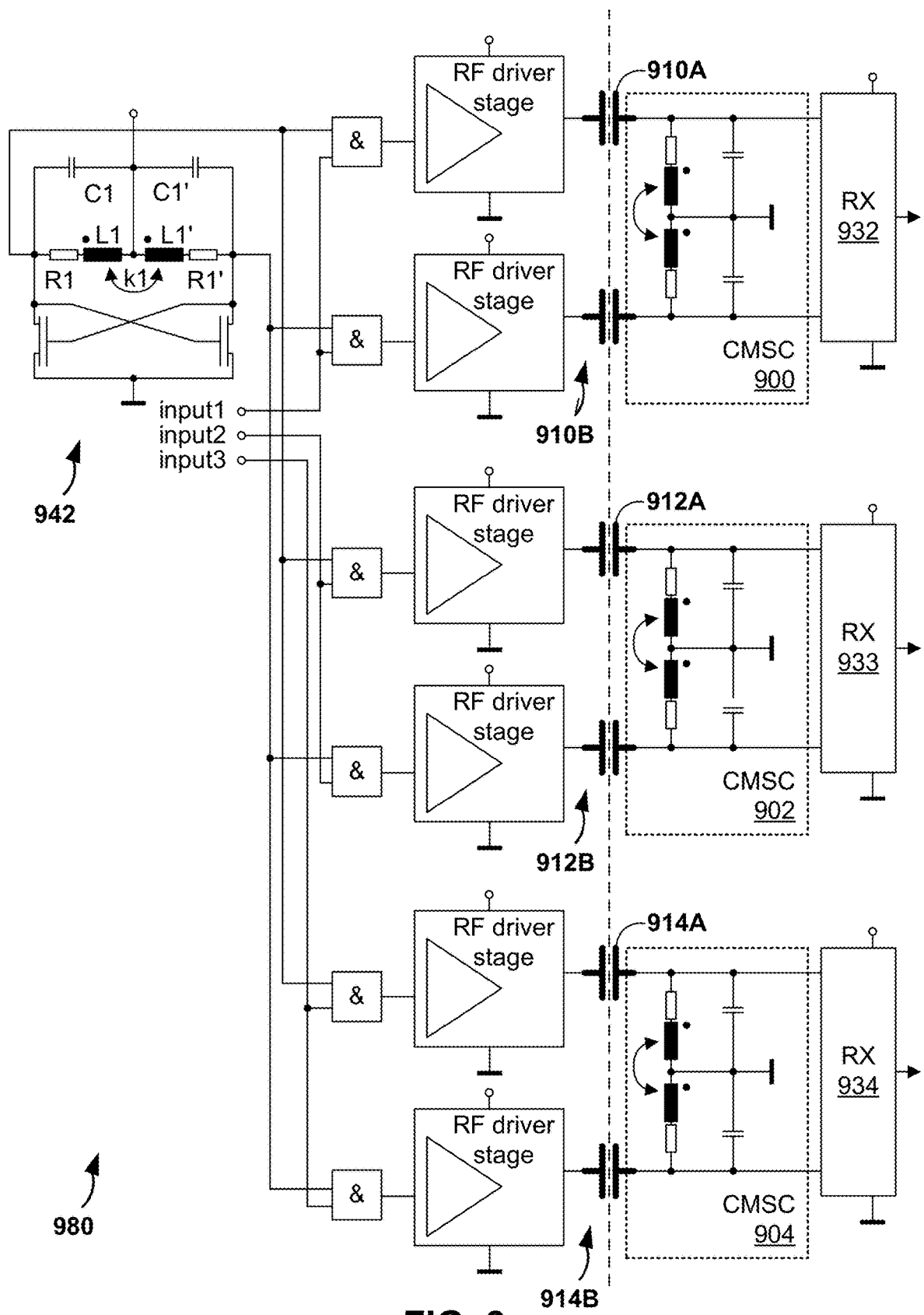

FIG. 9 depicts an alternate variation that can be used in addition to or as an alternative to the tunable circuits shown in FIGS. 7 and 8. Device 980 shown in FIG. 9 includes three pairs of capacitors 910A, 910B, 912A, 912B, 914A, and 914B, three common mode suppression circuits 900, 902, and 904, and receiver circuits 932-934. Oscillator 942 may be configured to generate differential signals for all three of receiver circuits 932-934, where each pair of capacitors transmits differential signals to a separate channel. The transmission of the differential signals to each of receiver circuits 932-934 can be controlled by activating or deactivating the input1, input2, and input3 signals. Thus, one oscillator 942 can be used to communicate along three channels, where each channel has a receiver circuit. Device 980 is depicted as including a pair of driver stages for each channel, but in some examples, a single pair of driver stages may be configured to deliver differential signals to each pair of capacitors.

Figure 10:
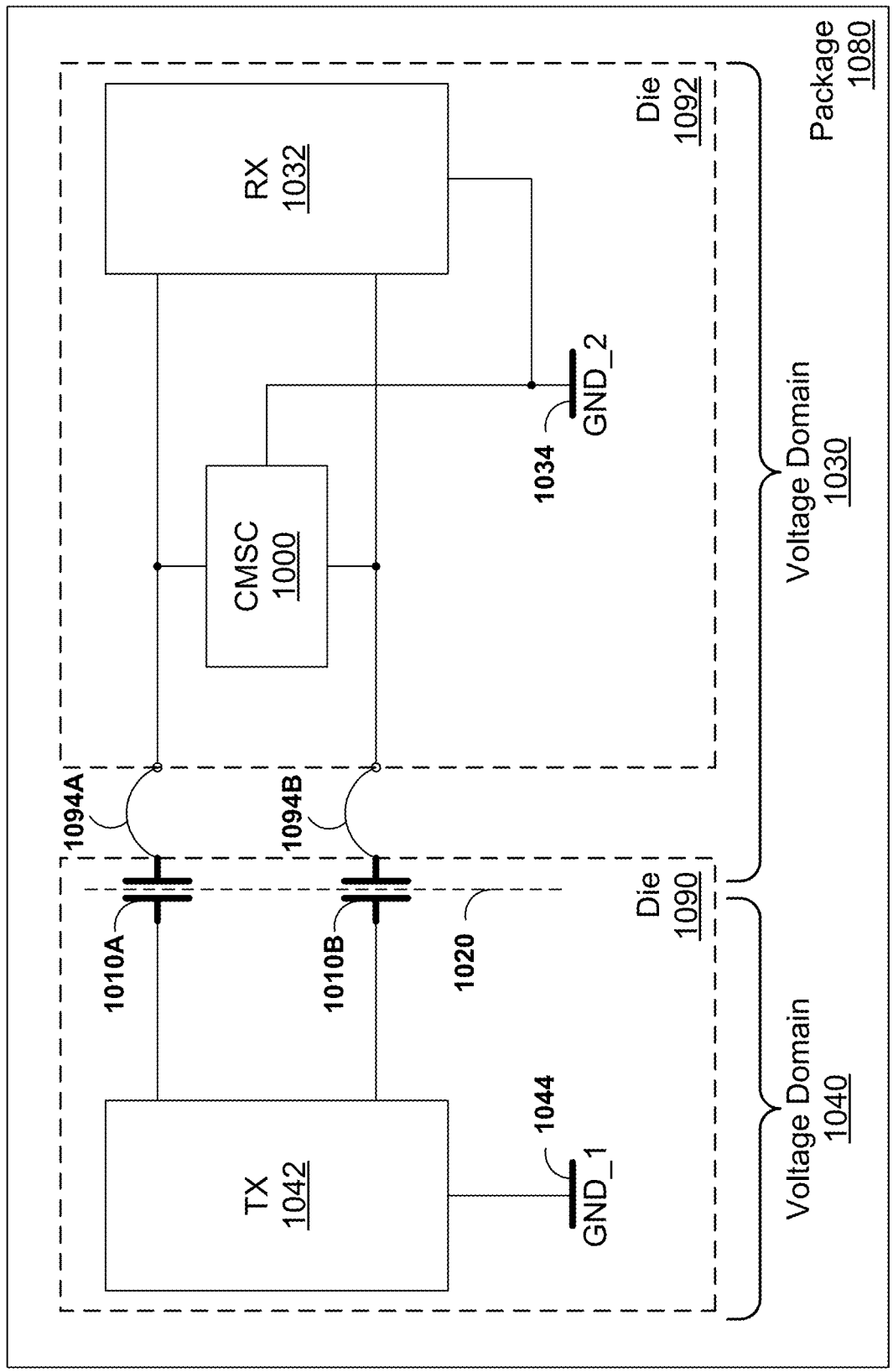
FIGS. 10-12 are conceptual block and circuit diagrams of example packages including two dies, in accordance with the techniques of this disclosure.
Figure 11:
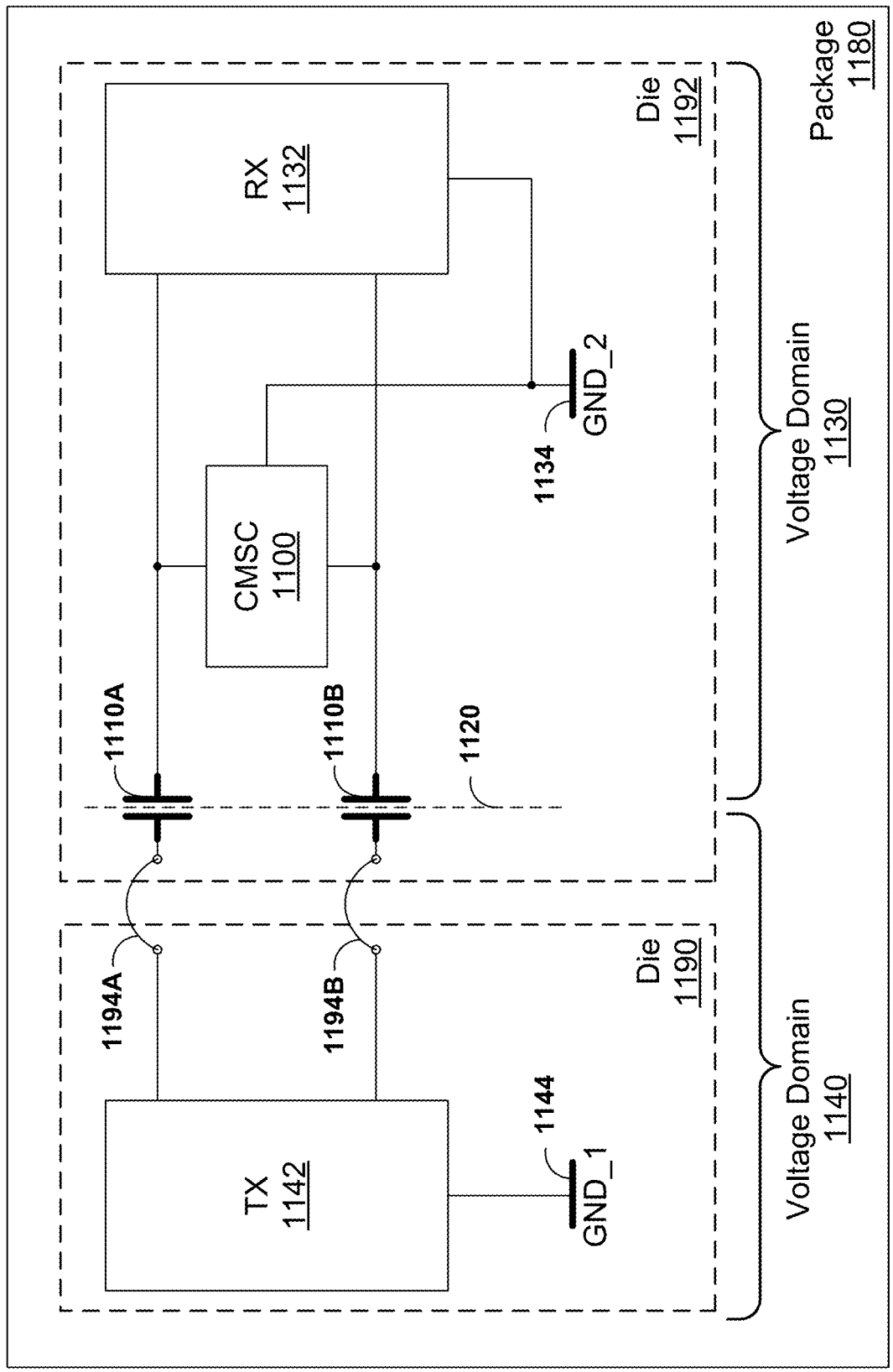
Figure 12:
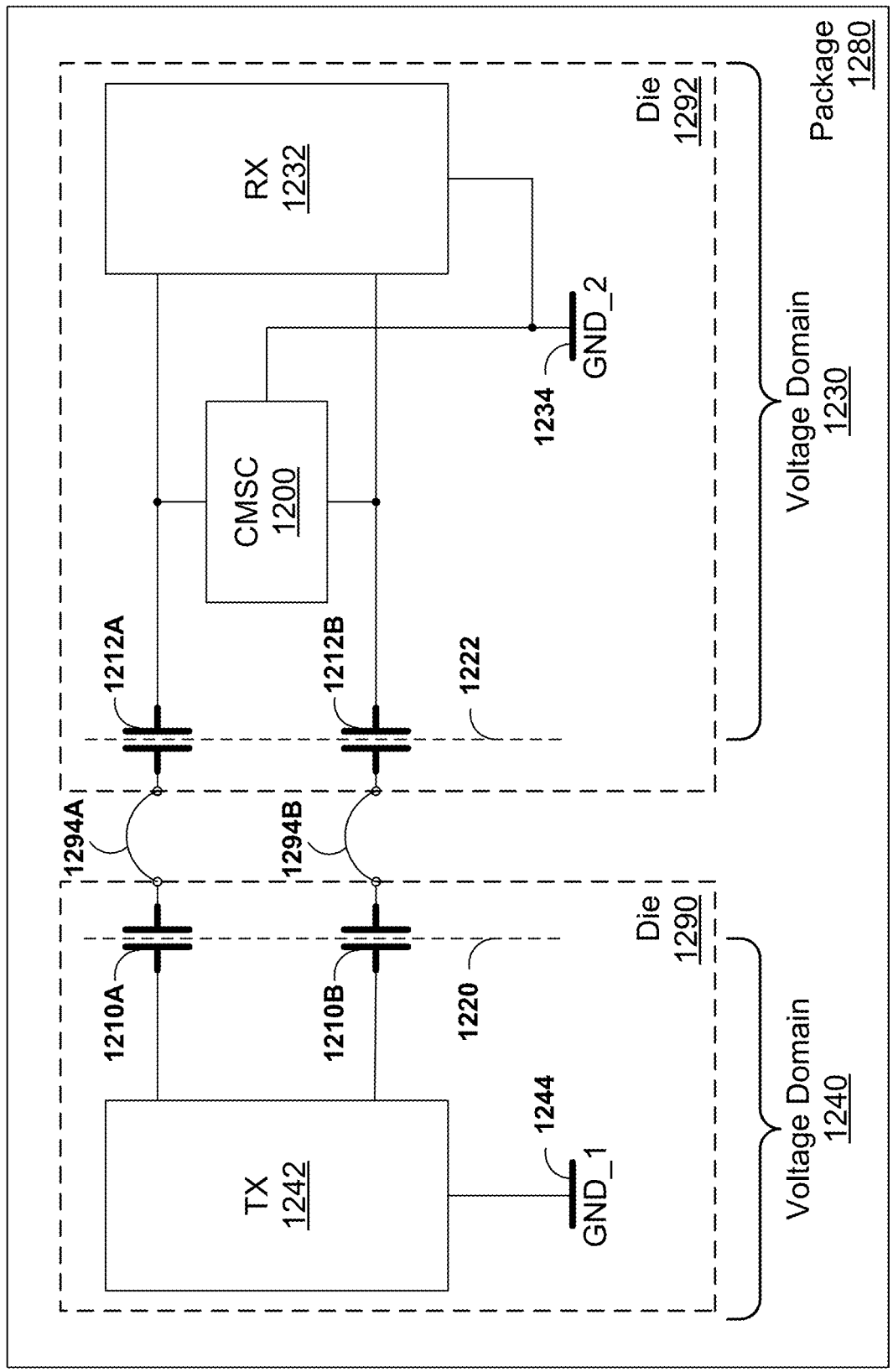

FIGS. 10-12 are conceptual block and circuit diagrams of example packages 1080, 1180, and 1280 including two dies, in accordance with the techniques of this disclosure. Package 1080, for example, includes dies 1090 and 1092. Galvanic isolation barrier 1020 and capacitors 1010A and 1010B are arranged on die 1090, such that bondwires 1094A and 1094B are within voltage domain 1030. Voltage domain 1030 also includes common mode suppression circuit 1000, receiver circuitry 1032, and reference ground connection 1034. Voltage domain 1040 includes transmitter circuitry 1042 and reference ground connection 1044.

In the example shown in FIG. 11, galvanic isolation barrier 1120 and capacitors 1110A and 1110B are arranged on die 1192, such that bondwires 1194A and 1194B are within voltage domain 1140. Voltage domain 1140 also includes transmitter circuitry 1142 and reference ground connection 1144. Voltage domain 1130 includes common mode suppression circuit 1100, receiver circuitry 1132, and reference ground connection 1134.

Packages 1080, 1180, and 1280 may include mold compound and/or any other insulative material between each pair of dies 1090, 1092, 1190, 1192, 1290, and 1292. The mold compound or insulative material may partially or completely surround each of dies 1090, 1092, 1190, 1192, 1290, and 1292. Each of the two dies shown in FIGS. 10-12 may be arranged on a separate leadframe. Although not shown in FIGS. 10-12, another possibility is that a single die may include two voltage domains, a galvanic isolation barrier, a transmitter, a receiver, and a common mode suppression circuit, where the voltage domains are separated by a galvanic isolation barrier passing through the oxides of the capacitors and through a deep trench on the single die.

Package 1280 can provide maximum isolation between two voltage domains because of capacitors 1210A, 1210B, 1212A, and 1212B. Voltage domain 1230 may be completely on die 1290, and voltage domain 1240 may be completely on die 1292. A third voltage domain may exist between voltage domains 1230 and 1240, where the third voltage domain includes bondwires 1294A and 1294B. By including a pair of capacitors on each of dies 1290 and 1292, the voltage experienced by each capacitor may be halved as compared to the voltage experienced by a single pair of capacitors (e.g., capacitors 1010A, 1010B, 1110A, and 1110B).

Figure 13:
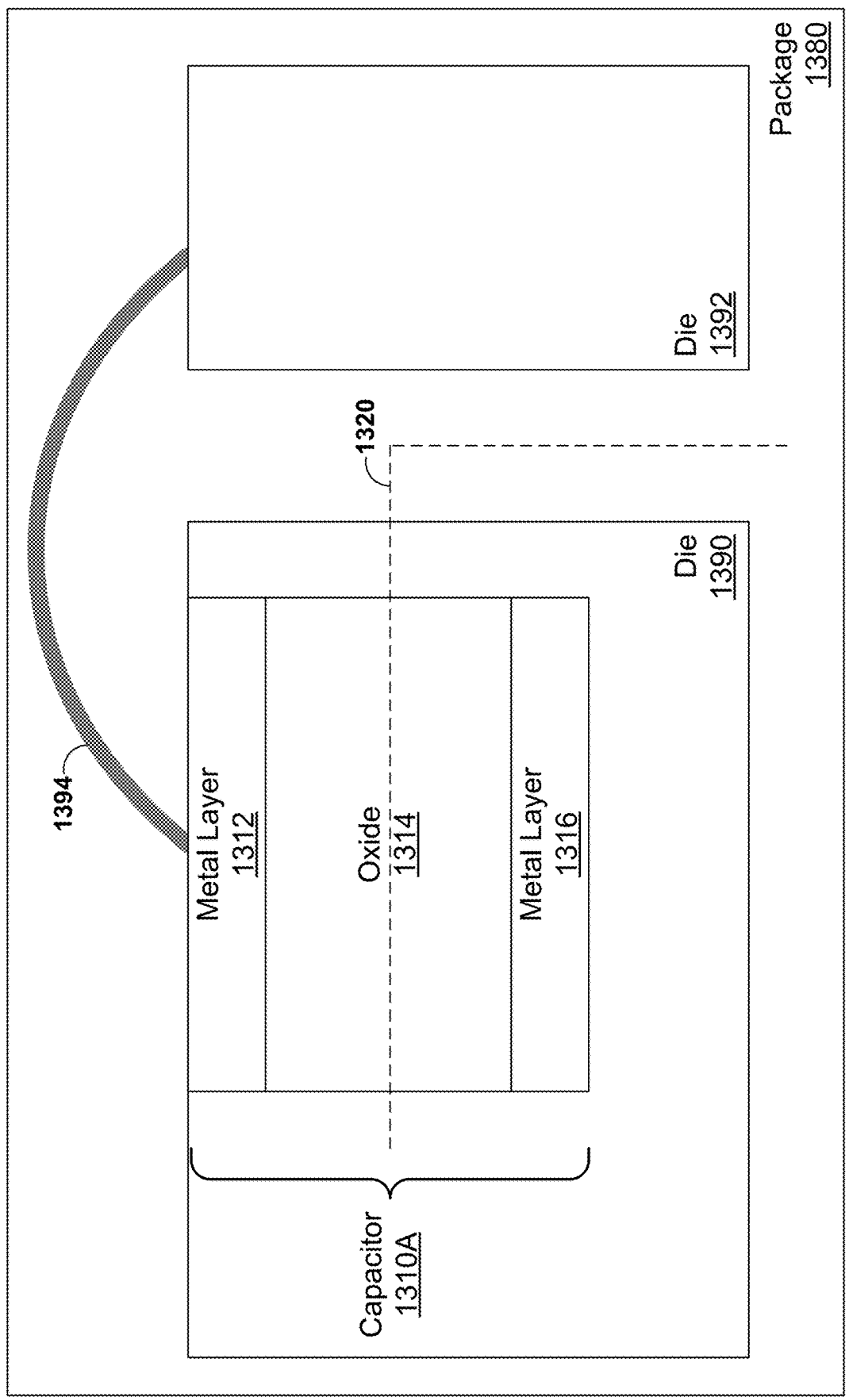
FIG. 13 is a conceptual block diagram of an example package including two dies connected by a bondwire, in accordance with the techniques of this disclosure.

FIG. 13 is a conceptual block diagram of an example package 1380 including two dies 1390 and 1392 connected by a bondwire 1394, in accordance with the techniques of this disclosure. FIG. 13 depicts an example similar to package 1080 shown in FIG. 10. Other examples are possible where capacitors are formed on die 1092 (similar to package 1180 shown in FIG. 11) or on both of dies 1090 and 1092 (similar to package 1280 shown in FIG. 12).

Capacitor 1310A includes metal layers 1312 and 1316 separated by oxide 1314. Oxide 1314 and the insulative material between dies 1390 and 1392 may form galvanic isolation barrier 1320. Oxide 1314 may approximately five, ten, fifteen, or twenty microns thick. In some examples, a thickness of oxide 1314 is greater than ten micrometers, which can result in a very high breakdown voltage. The distance between other layers in die 1390 may be less than one micrometer (e.g., three hundred nanometers).

In some examples, metal layer 1316 may be connected to transmitter circuitry. The transmitter circuitry can deliver a signal to metal layer 1316 for transmission across galvanic isolation barrier 1320. For example, pushing negative electrical charge to metal layer 1316 may attract positive electrical charge on metal layer 1312. Thus, the signal can propagate from metal layer 1312 through bondwire 1394 to die 1392, which may include a common mode suppression circuit for dampening common mode signals. Although FIGS. 10-13 depict the connection between dies as a bondwire, other connections are possible, such as leadframe connections, metal pad or plate connections, and/or pillar connections.

Figure 14:
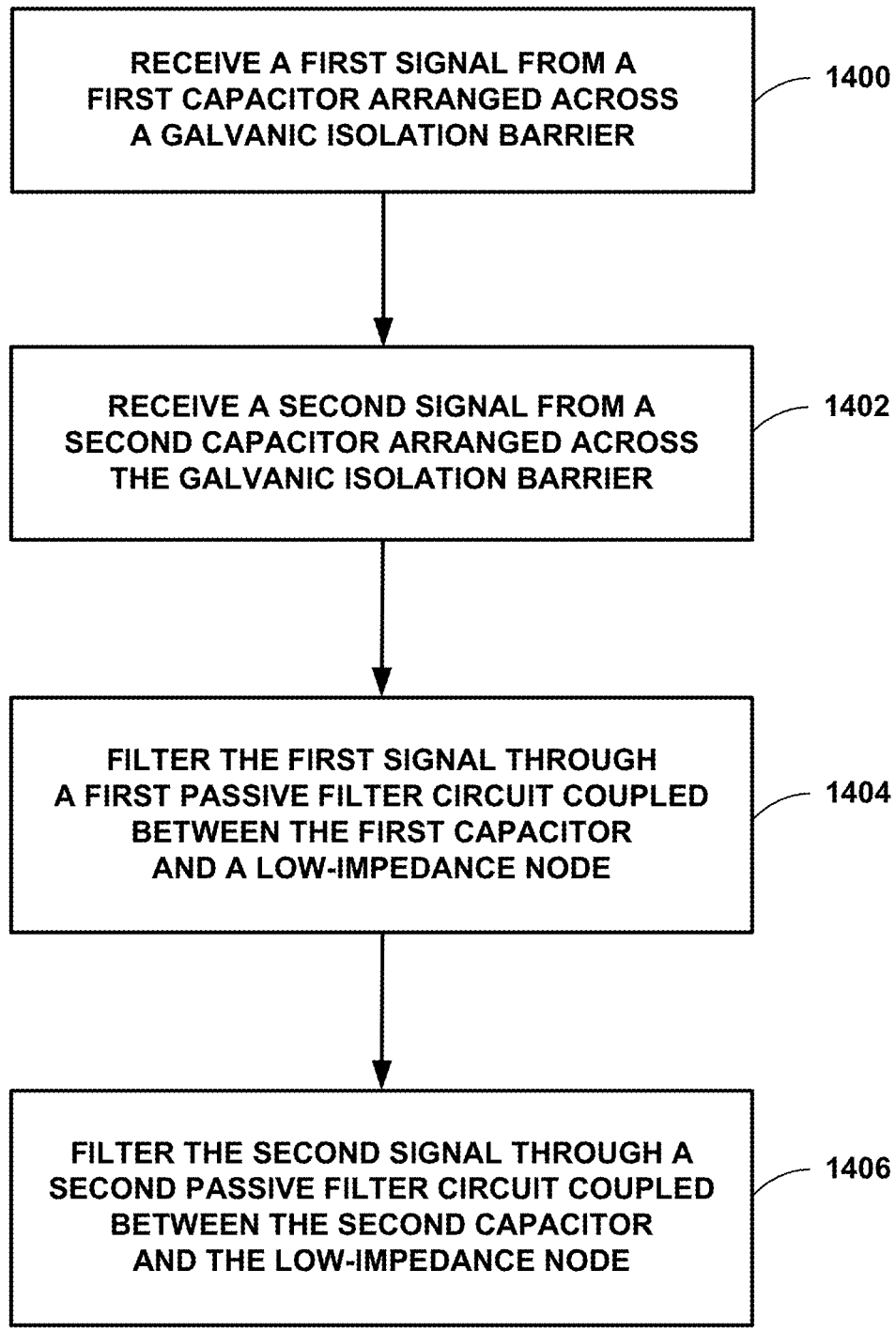
FIG. 14 is a flow diagram illustrating example techniques for suppressing a common mode pulse, in accordance with the techniques of this disclosure.

FIG. 14 is a flow diagram illustrating example techniques for suppressing a common mode pulse, in accordance with the techniques of this disclosure. The techniques of FIG. 14 are described with reference to the system shown in FIG. 1, although other components or devices may be used to perform similar techniques consistent with this disclosure.

In the example of FIG. 14, common mode suppression circuit 100 receives a first signal from capacitor 110A arranged across galvanic isolation barrier 120 (1400). Common mode suppression circuit 100 also receives a second signal from capacitor 110B arranged across galvanic isolation barrier 120 (1402). The first and second signals may be received concurrently by common mode suppression circuit 100 as a differential signal and/or a common mode signal. For example, common mode event 150 may include voltage increase or decrease transmitted by both of capacitors 110A and 110B.

Common mode suppression circuit 100 filters the first signal through a first passive RLC filter circuit coupled between capacitor 110A and reference ground connection 134 (1404). Common mode suppression circuit 100 filters the second signal through a second passive RLC filter circuit coupled between capacitor 110B and reference ground connection 134 (1406). Reference ground connection 134 is one example of a low-impedance node; other examples include a power-supply connection and/or any other electrical conductor that can carry a large amount of electric charge. Common mode suppression circuit 100 may have high impedance for differential signals at the transmission frequency and low impedance for common mode signals, allowing only the common mode elements of signals to pass through the passive RLC filter circuits to reference ground connection 134. Common mode suppression circuit 100 may be configured to suppress a common mode signal by at least 6 dB, preferably 10 dB or even 20 dB, with respect to a differential signal transmitted at the peak frequency.

The following numbered examples demonstrate one or more aspects of the disclosure.

Example 1. A device is arranged to include a galvanic isolation barrier between a first voltage domain and a second voltage domain. The device includes a first capacitor arranged across the galvanic isolation barrier and a second capacitor arranged across the galvanic isolation barrier. The first and second capacitors are configured to communicate differential signals between the first and second domains. The device also includes a common mode suppression circuit arranged in the second voltage domain and configured to suppress a common mode signal communicated by the first and second capacitors. The common mode suppression circuit includes a first passive RLC filter circuit coupled between the first capacitor and a low-impedance node. The common mode suppression circuit also includes a second passive RLC filter circuit coupled between the second capacitor and the low-impedance node.

Example 2. The device of example 1, wherein the first passive RLC filter circuit comprises a first inductive coil.

Example 3. The device of example 1 or example 2, wherein the second passive RLC filter circuit comprises a second inductive coil.

Example 4. The device of examples 1-3 or any combination thereof, wherein the first inductive coil is interleaved with the second inductive coil.

Example 5. The device of examples 1-4 or any combination thereof, wherein the first inductive coil overlaps the second inductive coil.

Example 6. The device of examples 1-5 or any combination thereof, wherein the first inductive coil and the second inductive coil are symmetrical about the low-impedance node.

Example 7. The device of examples 1-6 or any combination thereof, wherein a difference between electrical characteristics of the first passive RLC filter circuit and electrical characteristics of the second passive RLC filter circuit is less than twenty percent, or less than ten percent, or less than five percent, or less than two percent, or less than one percent.

Example 8. The device of examples 1-7 or any combination thereof, wherein the first passive RLC filter circuit and the second passive RLC filter circuit are symmetrical about the low-impedance node.

Example 9. The device of examples 1-8 or any combination thereof, further including an oscillator arranged in the first voltage domain.

Example 10. The device of examples 1-9 or any combination thereof, wherein the oscillator is configured to generate the differential signals at a transmission frequency.

Example 11. The device of examples 1-10 or any combination thereof, wherein a difference between the transmission frequency of the differential signals and a frequency associated with a peak in a transfer function of the first and second capacitors and the common mode suppression circuit is less than twenty percent, or less than ten percent, or less than five percent, or less than two percent, or less than one percent.

Example 12. The device of examples 1-11 or any combination thereof, wherein the oscillator is tunable to adjust the transmission frequency of the differential signals.

Example 13. The device of examples 1-12 or any combination thereof, wherein the common mode suppression circuit is tunable to adjust the frequency associated with the peak in the transfer function of the first and second capacitors and the common mode suppression circuit.

Example 14. The device of examples 1-13 or any combination thereof, wherein the first passive RLC filter circuit comprises a first inductive coil and a third capacitor.

Example 15. The device of examples 1-14 or any combination thereof, wherein the first inductive coil is coupled in parallel with the third capacitor between the first capacitor and the low-impedance node.

Example 16. The device of examples 1-15 or any combination thereof, wherein the second passive RLC filter circuit comprises a second inductive coil and a fourth capacitor.

Example 17. The device of examples 1-16 or any combination thereof, wherein the second inductive coil is coupled in parallel with the fourth capacitor between the second capacitor and the low-impedance node.

Example 18. The device of examples 1-17 or any combination thereof, further including a first set of driver stages arranged in the first voltage domain, wherein the first set of driver stages is configured to deliver a first set of signals to the first and second capacitors.

Example 19. The device of examples 1-18 or any combination thereof, further including a fifth capacitor arranged across the galvanic isolation barrier.

Example 20. The device of examples 1-19 or any combination thereof, further including a sixth capacitor arranged across the galvanic isolation barrier.

Example 21. The device of examples 1-20 or any combination thereof, further including a second set of driver stages arranged in the first voltage domain, wherein the second set of driver stages is configured to deliver a second set of signals to the fifth and sixth capacitors.

Example 22. The device of examples 1-21 or any combination thereof, further including a second common mode suppression circuit arranged in the second voltage domain.

Example 23. The device of examples 1-22 or any combination thereof, wherein the first passive RLC filter circuit includes a third capacitor, a first inductive coil, and no transistors.

Example 24. The device of examples 1-23 or any combination thereof, wherein the second passive RLC filter circuit includes a fourth capacitor, a second inductive coil, and no transistors.

Example 25. The device of examples 1-24 or any combination thereof, further including a first driver stage arranged in the first voltage domain, wherein the first driver stage is configured to generate a first on-off-keying signal based on an oscillating signal received from the oscillator.

Example 26. The device of examples 1-25 or any combination thereof, further including a second driver stage arranged in the first voltage domain, wherein the second driver stage is configured to generate a second on-off-keying signal based on the oscillating signal received from the oscillator.

Example 27. The device of examples 1-26 or any combination thereof, further including a receiver circuit coupled to the first and second capacitors.

Example 28. The device of examples 1-27 or any combination thereof, wherein the first passive RLC filter circuit is coupled between the first capacitor, the receiver circuit, and the low-impedance node.

Example 29. The device of examples 1-28 or any combination thereof, wherein the second passive RLC filter circuit is coupled between the second capacitor, the receiver circuit, and the low-impedance node.

Example 30. The device of examples 1-29 or any combination thereof, further including a package including a first and second die.

Example 31. The device of examples 1-30 or any combination thereof, wherein the first and second capacitors are arranged on the first die.

Example 32. The device of examples 1-31 or any combination thereof, wherein the common mode suppression circuit is arranged on the second die.

Example 33. The device of examples 1-32 or any combination thereof, wherein the first and second capacitors are arranged on the second die.

Example 34. The device of examples 1-33 or any combination thereof, further including a package including a single die, wherein a deep trench is arranged on the single die, wherein the common mode suppression circuit is arranged on a first side of the deep trench, and wherein the oscillator is arranged on a second side of the deep trench.

Example 35. A method includes receiving a first signal from a first capacitor arranged across a galvanic isolation barrier and receiving a second signal from a second capacitor arranged across the galvanic isolation barrier. The method may also include filtering the first signal through a first passive RLC filter circuit coupled between the first capacitor and a low-impedance node. The method can further include filtering the second signal through a second passive RLC filter circuit coupled between the second capacitor and the low-impedance node. Filtering the first and second signals comprises suppressing a common mode signal communicated by the first and second capacitors, and wherein the first and second passive RLC filter circuits are arranged in the second voltage domain.

Example 36. The method of example 35, further including generating an oscillating signal in the first voltage domain at a transmission frequency.

Example 37. The method of example 35 or example 36, further including generating a first on-off-keying signal based on the oscillating signal.

Example 38. The method of examples 35-37 or any combination thereof, further including generating a second on-off-keying signal based on the oscillating signal.

Example 39. The method of examples 35-38 or any combination thereof, further including delivering the first on-off-keying signal to a first side of the first capacitor, wherein a second side of the first capacitor is coupled to the first passive RLC filter circuit, and wherein the first side of the first capacitor is different from the second side of the first capacitor.

Example 40. The method of examples 35-39 or any combination thereof, further including delivering the second on-off-keying signal to a first side of the second capacitor, wherein a second side of the second capacitor is coupled to the second passive RLC filter circuit, and wherein the first side of the second capacitor is different from the second side of the second capacitor.

Example 41. The method of examples 35-40 or any combination thereof, wherein the first passive RLC filter circuit comprises a first inductive coil.

Example 42. The method of examples 35-41 or any combination thereof, wherein the second passive RLC filter circuit comprises a second inductive coil.

Example 43. The method of examples 35-42 or any combination thereof, wherein the first inductive coil is interleaved with the second inductive coil.

Example 44. The method of examples 35-43 or any combination thereof, wherein the first inductive coil overlaps the second inductive coil.

Example 45. The method of examples 35-44 or any combination thereof, wherein the first inductive coil and the second inductive coil are symmetrical about the low-impedance node.

Example 46. The method of examples 35-45 or any combination thereof, wherein a difference between electrical characteristics of the first passive RLC filter circuit and electrical characteristics of the second passive RLC filter circuit is less than twenty percent.

Example 47. The method of examples 35-46 or any combination thereof, wherein the first passive RLC filter circuit and the second passive RLC filter circuit are symmetrical about the low-impedance node.

Example 48. The method of examples 35-47 or any combination thereof, wherein a difference between the transmission frequency of the differential signals and a frequency associated with a peak in a transfer function of the first and second capacitors and the common mode suppression circuit is less than twenty percent, or less than ten percent, or less than five percent, or less than two percent, or less than one percent.

Example 49. The method of examples 35-48 or any combination thereof, further including adjusting the transmission frequency of the differential signal by tuning a capacitor of the oscillator.

Example 50. The method of examples 35-49 or any combination thereof, further including adjusting a frequency associated with a peak in a transfer function of the first and second capacitors and the common mode suppression circuit by tuning a capacitor of the common mode suppression circuit.

Example 51. A system includes a first capacitor arranged across a galvanic isolation barrier and a second capacitor arranged across the galvanic isolation barrier. The system also includes an oscillator configured to generate a control signal, a first driver stage configured to generate a first driver signal based on the control signal and to deliver the first driver signal to a first side of the first capacitor, and a second driver stage configured to generate a second driver signal based on the control signal and to deliver the second driver signal to a first side of the second capacitor. The system further includes a receiver circuit and a common mode suppression circuit include a first passive RLC filter circuit coupled between a second side of the first capacitor, the receiver circuit, and the low-impedance node, where the second side of the first capacitor is different than the first side of the first capacitor, and where the first passive RLC filter circuit is configured to receive the first driver signal from the first capacitor. The common mode suppression circuit also includes a second passive RLC filter circuit coupled between the second capacitor, the receiver circuit, and the low-impedance node, where the second side of the second capacitor is different than the first side of the second capacitor, and where the second passive RLC filter circuit is configured to receive the second driver signal from the second capacitor.

Example 52. The system of example 51, further including the elements of the device of examples 1-34 or any combination thereof.

Example 53. A system comprising means for performing the method of examples 35-47 or any combination thereof.

Various examples of the disclosure have been described. Any combination of the described systems, operations, or functions is contemplated. These and other examples are within the scope of the following claims.

What is claimed is:

1. A device arranged to include a galvanic isolation barrier between a first voltage domain and a second voltage domain, the device comprising:
    a first capacitor arranged across the galvanic isolation barrier;
    a second capacitor arranged across the galvanic isolation barrier, wherein the first and second capacitors are configured to communicate differential signals at a transmission frequency between the first and second domains, wherein the transmission frequency is defined by an oscillator arranged in the first voltage domain; and
    a common mode suppression circuit arranged in the second voltage domain and configured to suppress a common mode signal communicated by the first and second capacitors,
    wherein a difference between the transmission frequency of the differential signals and a frequency associated with a peak in a transfer function of the first and second capacitors and the common mode suppression circuit is less than twenty percent, and
    wherein the common mode suppression circuit comprises:
        a first passive RLC filter circuit coupled between the first capacitor and a low-impedance node; and
        a second passive RLC filter circuit coupled between the second capacitor and a low-impedance node.

2. The device of claim 1,
    wherein the first passive RLC filter circuit comprises a first inductive coil,
    wherein the second passive RLC filter circuit comprises a second inductive coil, and
    wherein the first inductive coil is interleaved with the second inductive coil.

3. The device of claim 2, wherein the first inductive coil overlaps the second inductive coil.

4. The device of claim 2, wherein the first inductive coil and the second inductive coil are symmetrical about the low-impedance node.

5. The device of claim 1, wherein a difference between electrical characteristics of the first passive RLC filter circuit and electrical characteristics of the second passive RLC filter circuit is less than twenty percent.

6. The device of claim 1, wherein the first passive RLC filter circuit and the second passive RLC filter circuit are symmetrical about the low-impedance node.

7. The device of claim 1, further comprising the oscillator, wherein the oscillator is tunable to adjust the transmission frequency of the differential signals.

8. The device of claim 1, wherein the common mode suppression circuit is tunable to adjust the frequency associated with the peak in the transfer function of the first and second capacitors and the common mode suppression circuit.

9. The device of claim 1,
    wherein the first passive RLC filter circuit comprises a first inductive coil and a third capacitor,
    wherein the first inductive coil is coupled in parallel with the third capacitor between the first capacitor and the low-impedance node,
    wherein the second passive RLC filter circuit comprises a second inductive coil and a fourth capacitor, and
    wherein the second inductive coil is coupled in parallel with the fourth capacitor between the second capacitor and the low-impedance node.

10. The device of claim 1, further comprising:
    a first set of driver stages arranged in the first voltage domain, wherein the first set of driver stages is configured to deliver a first set of signals to the first and second capacitors;
    a third capacitor arranged across the galvanic isolation barrier;
    a fourth capacitor arranged across the galvanic isolation barrier;
    a second set of driver stages arranged in the first voltage domain, wherein the second set of driver stages is configured to deliver a second set of signals to the third and fourth capacitors; and
    a second common mode suppression circuit arranged in the second voltage domain.

11. The device of claim 1,
    wherein the first passive RLC filter circuit includes a third capacitor, a first inductive coil, and no transistors, and
    wherein the second passive RLC filter circuit includes a fourth capacitor, a second inductive coil, and no transistors.

12. The device of claim 1, further comprising:
    the oscillator;
    a first driver stage arranged in the first voltage domain, wherein the first driver stage is configured to generate a first on-off-keying signal based on the oscillating signal received from the oscillator; and
    a second driver stage arranged in the first voltage domain, wherein the second driver stage is configured to generate a second on-off-keying signal based on the oscillating signal received from the oscillator,
    wherein the differential signals comprise the first and second on-off keying signals.

13. The device of claim 1, further comprising a receiver circuit,
    wherein the first passive RLC filter circuit is coupled between the first capacitor, the receiver circuit, and the low-impedance node, and
    wherein the second passive RLC filter circuit is coupled between the second capacitor, the receiver circuit, and the low-impedance node.

14. The device of claim 1, further comprising a package comprising a first die and a second die,
    wherein the first and second capacitors are arranged on the first die, and
    wherein the common mode suppression circuit is arranged on the second die.

15. A method comprising:
    generating an oscillating signal at a transmission frequency in a first voltage domain;
    receiving a first signal at the transmission frequency from a first capacitor arranged across a galvanic isolation barrier, wherein the galvanic isolation barrier separates the first voltage domain from a second voltage domain;

receiving a second signal at the transmission frequency from a second capacitor arranged across the galvanic isolation barrier, wherein the first and second signal comprise a differential signal;

filtering the first signal through a first passive RLC filter circuit of a common mode suppression circuit coupled between the first capacitor and a low-impedance node; and filtering the second signal through a second passive RLC filter circuit of the common mode suppression circuit coupled between the second capacitor and a low-impedance node, wherein a difference between the transmission frequency of the differential signal and a frequency associated with a peak in a transfer function of the first and second capacitors and the common mode suppression circuit is less than twenty percent, wherein filtering the first and second signals comprises suppressing a common mode signal communicated by the first and second capacitors, and wherein the first and second passive RLC filter circuits are arranged in the second voltage domain.

16. The method of claim 15, further comprising:
generating a first on-off-keying signal based on the oscillating signal;
generating a second on-off-keying signal based on the oscillating signal;
delivering the first on-off-keying signal to a first side of the first capacitor, wherein a second side of the first capacitor is coupled to the first passive RLC filter circuit, and wherein the first side of the first capacitor is different from the second side of the first capacitor; and
delivering the second on-off-keying signal to a first side of the second capacitor,
wherein the differential signal comprises the first and second on-off keying signals,
wherein a second side of the second capacitor is coupled to the second passive RLC filter circuit, and
wherein the first side of the second capacitor is different from the second side of the second capacitor.

17. A system arranged to include a galvanic isolation barrier between a first voltage domain and a second voltage domain comprising:
a first capacitor arranged across a galvanic isolation barrier;
a second capacitor arranged across the galvanic isolation barrier, wherein the first and second capacitors are configured to communicate differential signals between the first and second domains;
an oscillator configured to generate a first control signal and a second control signal at a transmission frequency, wherein the oscillator is arranged in the first voltage domain;
a first driver stage configured to generate a first driver signal based on the first control signal and to deliver the first driver signal to a first side of the first capacitor;
a second driver stage configured to generate a second driver signal based on the second control signal and to deliver the second driver signal to a first side of the second capacitor, wherein the first and second driver stages are arranged in the first voltage domain, wherein the differential signals comprise the first and second driver signals;
a receiver circuit arranged in the second voltage domain; and
a common mode suppression circuit arranged in the second voltage domain, the common mode suppression circuit comprising:
a first passive RLC filter circuit coupled between a second side of the first capacitor, the receiver circuit, and the low-impedance node, wherein the second side of the first capacitor is different than the first side of the first capacitor, and wherein the first passive RLC filter circuit is configured to receive the first driver signal from the first capacitor; and
a second passive RLC filter circuit coupled between the second capacitor, the receiver circuit, and the low-impedance node, wherein the second side of the second capacitor is different than the first side of the second capacitor, and wherein the second passive RLC filter circuit is configured to receive the second driver signal from the second capacitor,
wherein a difference between the transmission frequency and a frequency associated with a peak in the transfer function of the common mode suppression circuit, the first capacitor and the second capacitor, for the differential signals, is less than twenty percent.

18. The system of claim 17,
wherein the first passive RLC filter circuit comprises a first inductive coil,
wherein the second passive RLC filter circuit comprises a second inductive coil,
wherein the first inductive coil is interleaved with the second inductive coil, and
wherein the first inductive coil overlaps the second inductive coil.

19. The system of claim 18,
wherein the first inductive coil and the second inductive coil are symmetrical about the low-impedance node,
wherein a difference between electrical characteristics of the first passive RLC filter circuit and electrical characteristics of the second passive RLC filter circuit is less than twenty percent, and
wherein the first passive RLC filter circuit and the second passive RLC filter circuit are symmetrical about the low-impedance node.

20. The system of claim 17, further comprising the oscillator,
wherein the oscillator is tunable to adjust the transmission frequency of the differential signals, and
wherein the common mode suppression circuit is tunable to adjust the frequency associated with the peak in the transfer function of the first and second capacitors and the common mode suppression circuit.

* * * * *